US006826741B1

(12) United States Patent
Johnson et al.

(10) Patent No.: US 6,826,741 B1
(45) Date of Patent: Nov. 30, 2004

(54) FLEXIBLE I/O ROUTING RESOURCES

(75) Inventors: Brian D. Johnson, Sunnyvale, CA (US); Andy L. Lee, San Jose, CA (US); Cameron McClintock, Mountain View, CA (US); Triet Nguyen, San Jose, CA (US); David Jefferson, Morgan Hill, CA (US); Paul Leventis, Toronto (CA); David Lewis, Toronto (CA); Vaughn Betz, Toronto (CA); Michael Chan, Scarborough (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/289,629

(22) Filed: Nov. 6, 2002

Related U.S. Application Data

(60) Provisional application No. 60/338,498, filed on Nov. 6, 2001.

(51) Int. Cl.[7] ............................................. G06F 17/50
(52) U.S. Cl. .............................. 716/12; 716/16; 716/17
(58) Field of Search ............................... 716/12, 16, 17

(56) References Cited

U.S. PATENT DOCUMENTS 5,396,601 A * 3/1995 Tokushige et al. .......... 710/313
6,275,491 B1 * 8/2001 Prasad et al. ................ 370/389
6,363,319 B1 * 3/2002 Hsu ............................ 701/202

OTHER PUBLICATIONS

"XC4000E and XC4000X Series Field programmable Gate Arrays", XILINX, product specification Version 1.6 May 14, 1999, 9 pgs.
"Virtex™ –E 1.8 V Field Programmable Gate Arrays", XILINX, product specification v2–2, 7/23, 2001, 7 pgs.
Kluwer Academic Publishers, Vaughn Betz, Jonathan Rose, Alexander Marquardt, *Architecture and CAD for Deep–Submicron FPGAs*, Chapter 2.1 (pp. 11–18), Chapter 4 (pp. 63–103), Chapter 5 (pp. 105–126), and Chapter 7 (pp. 151–190), (Mar. 1999).

* cited by examiner

*Primary Examiner*—Vuthe Siek
*Assistant Examiner*—Sun James Lin
(74) *Attorney, Agent, or Firm*—Morrison & Foerster LLP (57) ABSTRACT

In one aspect, flexible routing resources provided are comprising an arrangement of staggered line segments on a periphery of an electronic device. In another aspect, I/O bus lines a re coupled to receive signals from and to provide signals to other bus lines, core routing, and I/O circuitry, thus facilitating the use of the I/O bus for a variety of routes that may include I/O-to-core, core-to-I/O and core-to-core routes. In another aspect, a length of I/O bus lines is optimized for speed over long signal routes with high fanout. In another aspect, the loading effects of high fanout are minimized by using a plurality of tapping buffers to couple lines to both core routing and to I/O circuitry. In another aspect, a spiraling technique is provided that allows a continuous bus having line segments of consistent length whether or not the number of I/O blocks is an integral multiple of the selected logical length for line segments.

27 Claims, 4 Drawing Sheets

FLEXIBLE I/O ROUTING RESOURCES

CROSS-REFERENCE TO RELATED APPLICATIONS

The present application claims the benefit of U.S. Provisional Application No. 60/338,498, entitled Flexible Peripheral Routing Resource For I/O Interface filed on Nov. 6, 2001, which is incorporated herein by reference.

BACKGROUND OF THE INVENTION

1. Field of the Invention

The present invention relates to peripheral routing resources in an electronic device, particularly with respect to programmable logic devices.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical conductors that may or may not extend the length of the PLD's core and connect to input/out ("I/O") blocks.

I/O blocks typically include buffers, registers, and may include other elements. I/O blocks (sometimes referred by other labels, e.g., I/O elements, or "IOEs" the term "I/O block" may also refer to groups of I/O elements—I/O buffers, I/O cells, "IOs", etc.) perform I/O functions that may include, for example, implementing I/O standards (e.g. LVTTL, LVCMOS, 2.5V, 1.8V, etc.) that define the requirements for transmitting/receiving a logical "1" or "0." I/O functions also may include, for example, buffering data, routing data to and from the various LEs of the PLD, the demultiplexing of signals, and other functions. I/O blocks and other circuitry such as, for example, phase locked loops (PLLs), delay locked loops (DLLs), and other clock circuitry may benefit from being proximate to the periphery and pins of the device.

An I/O bus typically provides routing capability between an integrated circuit's core logic and its I/O circuitry. An integrated circuit's I/O circuitry is typically arranged on a periphery of the chip, proximate to the device's pins. In one example of past I/O buses, routing is provided into the core on the same side of the device that a signal is received via the I/O circuitry. The core routing is then used to deliver the signal to its destination or destinations. Similarly, if core logic needs to deliver a signal to the I/O circuitry, it is routed through the core routing to the I/O bus lines on the side of the device where the destination I/O circuitry resides. In an example of such a past architecture, a particular I/O bus line is dedicated to provide either core-to-I/O routing or I/O-to-core routing, but not both.

As core density and complexity increases and as the volume of signals processed by a device grows, it is increasingly cumbersome to rely on core routing to distribute a signals that must travel greater distances than the typical core route. Furthermore, even within the core, it may be cumbersome to route signals over core routing between two points whose distance apart presents a signal route greater than that typical of other core routes, particularly given that core line lengths are typically optimized for shorter routes. Thus, I/O routing resources are needed that can be utilized by core circuitry to deliver signals over longer routes within the core for which existing core routing is not optimized.

If I/O routing resources are to be relied on for lengthy signal routes, then it is increasingly important that the length of individual I/O lines is speed-optimized long routes. Thus, there is a need for an I/O bus architecture that accommodates the line length necessary to achieve such optimization in a particular integrated circuit. Because the optimal line length will vary depending on many factors related to the design and fabrication of a particular device, there is a need for an architecture that can adapt to a range of optimal line lengths.

As device complexity and signal volume grow, it is also increasingly necessary to provide highly flexible routing in the I/O bus so that multiple I/O bus routing options are readily accessible from a variety of locations on the device.

There is also a need to accommodate increasing fanout of signals routed on an I/O bus (i.e., a given signal is delivered to many locations). As fanout increases, there is a need to provide I/O bus routing that can handle increasing fanout while minimizing the added capacitance and other loading such fanout can cause.

If an I/O bus architecture forms a bus around the entire perimeter of a device, it may be difficult to design the device such that all I/O routing lines are of the same logical length. In particular, if the desired number of I/O blocks around a chip's periphery is not an integral multiple of the logical length of optimized lines, then it is difficult to form a continuous loop of connected bus lines without one or more of the lines being of a length different than the optimized length. This is undesirable not only because some lines are then not optimized, but also because creating routing algorithms is more difficult if the lines relied on are of inconsistent length. Thus, there is a need for a layout of lines that can accommodate a consistent logical line length whether or not the number of I/O blocks is an integral multiple of the desired logical line length.

SUMMARY OF THE INVENTION

In one aspect, the present invention provides flexible routing resources comprising an arrangement of staggered line segments on a periphery of an electronic device. In another aspect, peripheral bus lines are coupled to receive signals from and provide signals to other bus lines, core routing, and I/O circuitry, thus facilitating the use of the I/O bus for a variety of routes that may include I/O-to-core, core-to-I/O, I/O-to-I/O and core-to-core routes. In another aspect, a length of peripheral bus lines is optimized for speed over long signal routes with high fanout. In another aspect, the loading effects of high fanout are minimized by using a plurality of tapping buffers to couple lines to both core routing and to I/O circuitry. In another aspect, a spiraling technique is provided that allows a continuous bus having lines of consistent optimal length whether or not the number of I/O blocks is an integral multiple of the logical length of optimized lines.

BRIEF DESCRIPTION OF THE DRAWINGS

The novel features of the invention are set forth in the appended claims. However, for purpose of explanation, several aspects of a particular embodiment of the invention and of an alternative embodiment of the invention are described by reference to the following figures.

FIG. 2 illustrates further details of the I/O bus portion illustrated in FIG. 1. FIG. 2 shows routing associated with I/O bus lines along a top edge of a PLD in accordance with an aspect of the present invention.

FIG. 3 illustrates further details of the I/O bus portion illustrated in FIG. 1. FIG. 3 shows routing associated with I/O bus lines along a side edge of a PLD in accordance with an aspect of the present invention.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
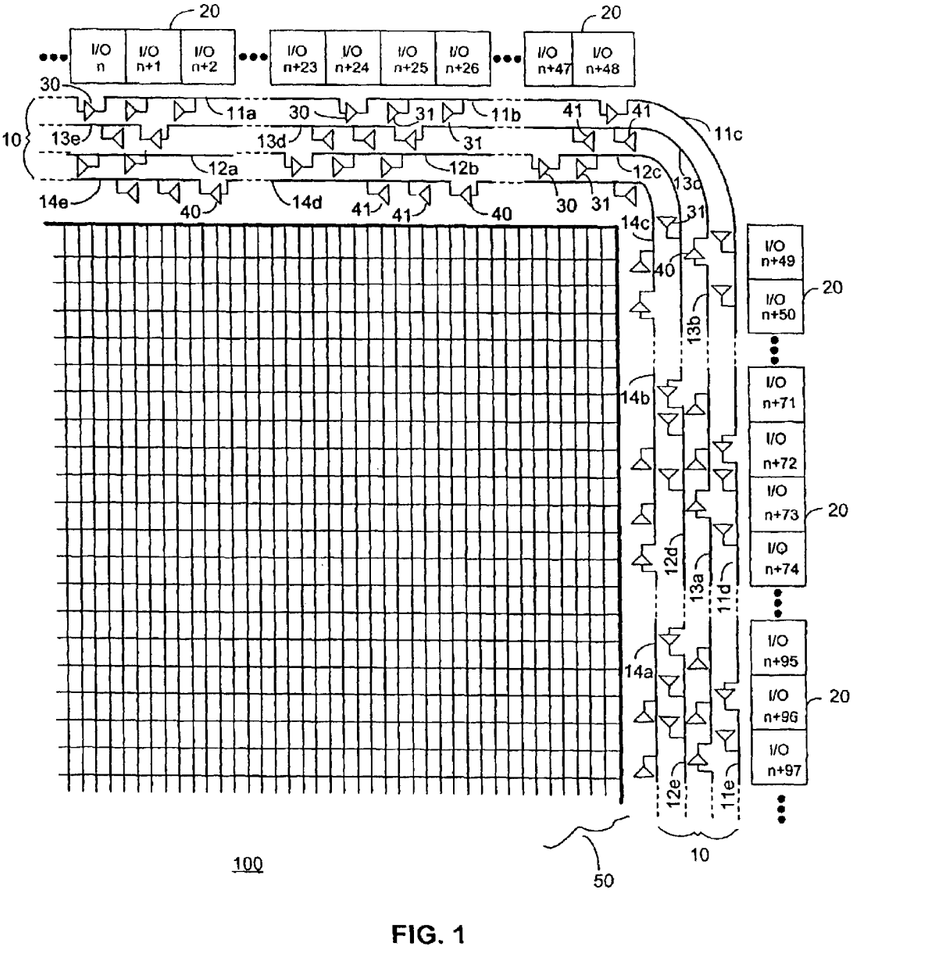
FIG. 1 illustrates a portion of an electronic device including a portion of an I/O bus in accordance with an aspect of the present invention.

FIG. 1 illustrates a portion 100 of a programmable logic device (PLD) comprising I/O bus portion 10, I/O circuitry portions in the form of I/O blocks 20 (labeled n to n+97), and a portion of core 50.

I/O bus portion 10 comprises pluralities of line segments including a first plurality of line segments 11a, 11b, 11c, 11d, and 11e; and a second plurality of line segments 12a, 12b, 12c, and 12e. I/O bus portion 10 also comprises additional pluralities of line segments including a third plurality of line segments 13a, 13b, 13c, 13d, and 13e; and a fourth plurality of line segments 14a, 14b, 14c, 14d, and 14e. First line segments 11a–11e and second line segments 12a–12e are coupled by driving circuitry 30 to drive signals received from one line segment onto another line segment as shown. The term "coupled" herein is considered broad enough to include not just coupling through non-programmable coupling circuitry, but also coupling by field programmable circuitry even if that circuitry is not, in a particular configuration, programmed to provide an active pathway between the two points considered to be "coupled." As shown and described in further detail with regard to FIG. 2 and FIG. 3, selection circuitry may be provided and coupled to driving circuitry 30 so that signals received from core 50 or from I/O blocks 20 may be selected for driving onto the line segments 11a–11e and 12a–12e through driving circuitry 30 (see FIGS. 2–3 and accompanying text). If, for example, such selection circuitry is programmed for a particular application such that a given line segment can only receive signals from the core and not from another line segment, that given line segment is still considered to be "coupled" to the other line segment for purposes herein because such selection circuitry could have been programmed to select signals from the other line segment for driving the given line segment.

Figure 2:
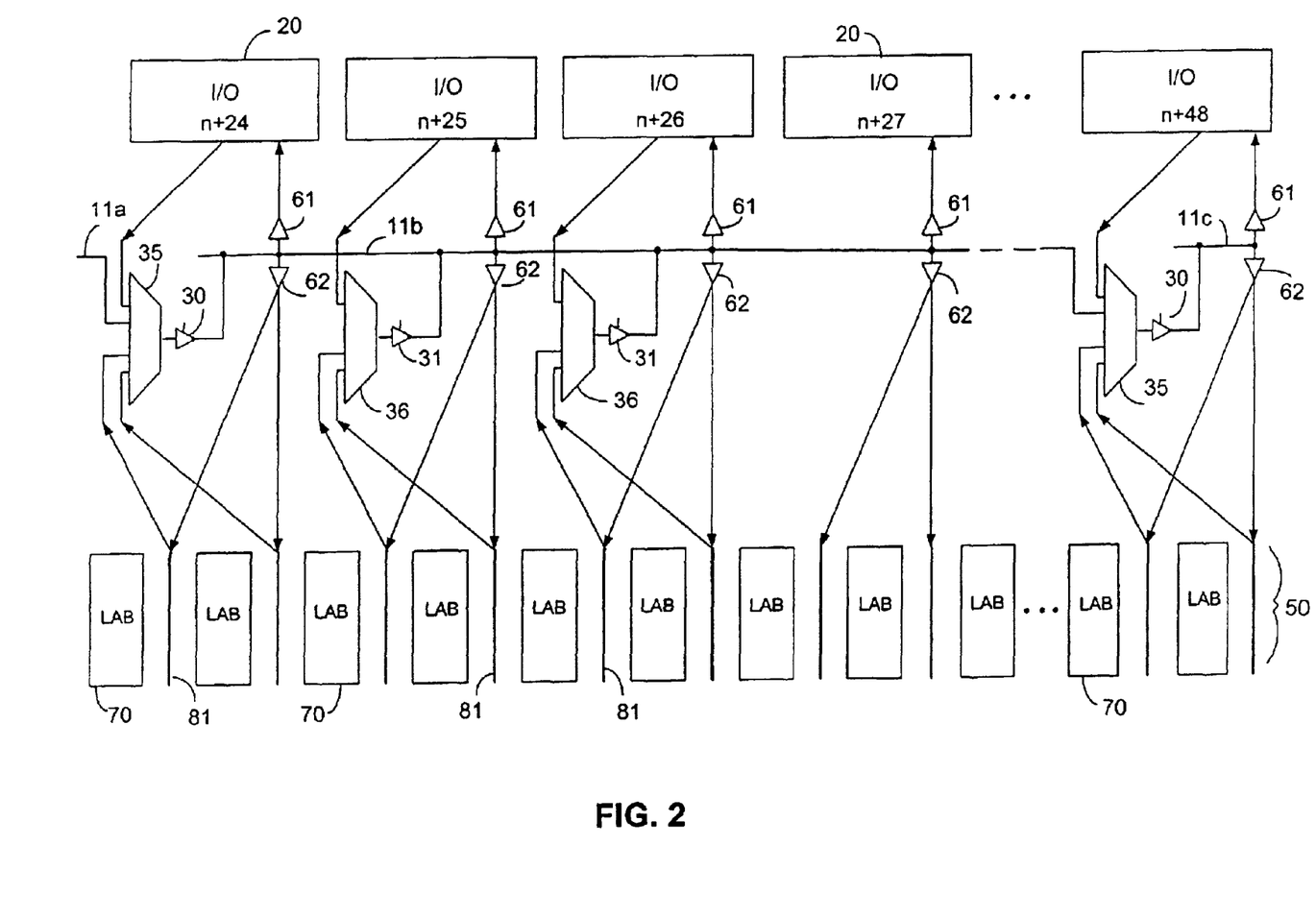
Figure 3:
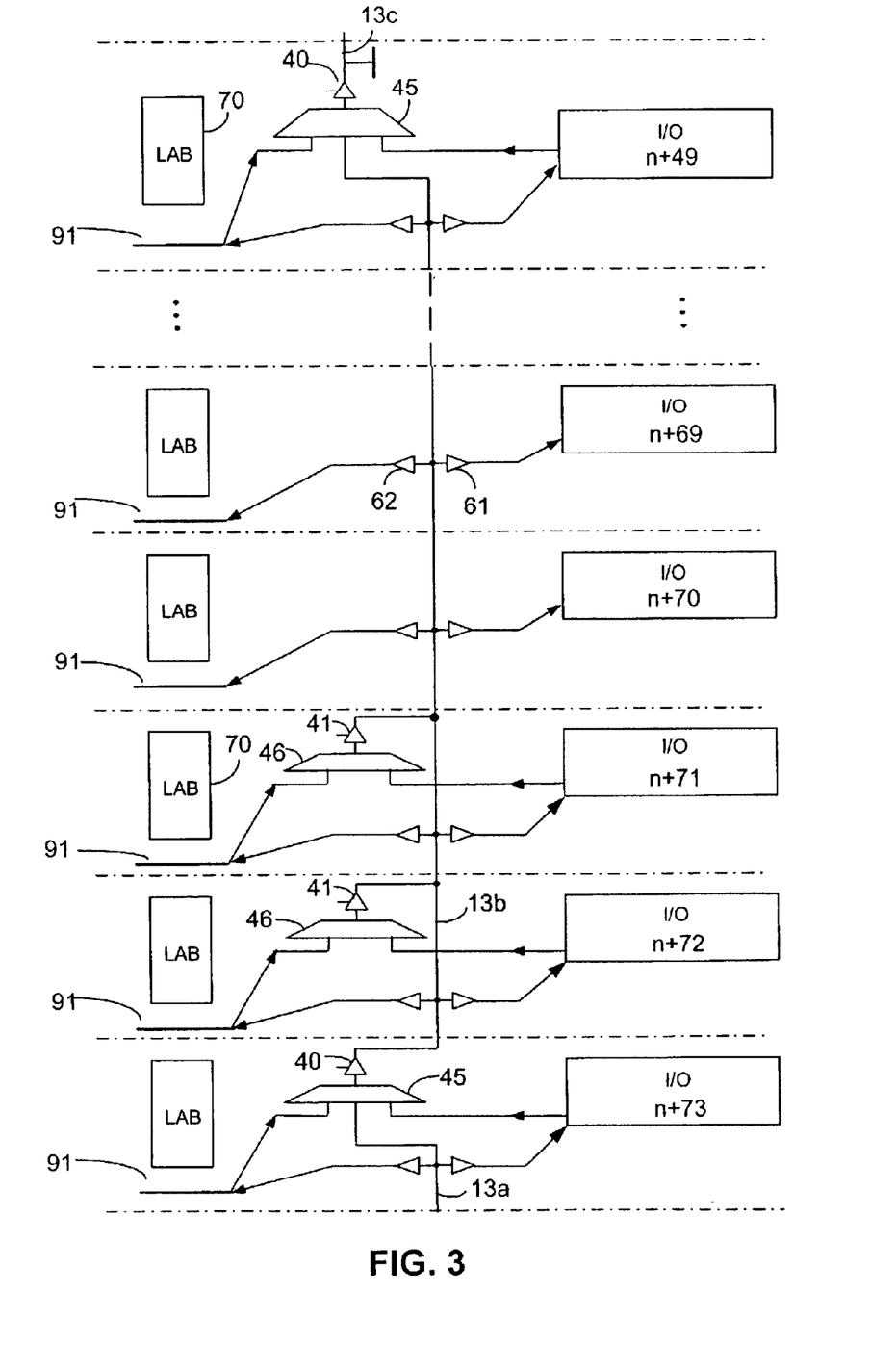

Continuing with the description of FIG. 1, additional driving circuitry 31 is also coupled to line segments 11a–11e and 12a–12e for driving signals received through selection circuitry from either core 50 or I/O blocks 20 (selection circuitry shown and described in further detail with regard to FIG. 2 and FIG. 3). Driving circuitry 30 and additional driving circuitry 31 are coupled to line segments 11a–11e and 12a–12e to drive signals in a clockwise direction as shown.

Third line segments 13a–13e and fourth line segments 14a–14e are coupled by driving circuitry 40 to drive signals received from one line segment onto another line segment as shown. As shown and described in further detail with regard to FIG. 2 and FIG. 3, selection circuitry may be provided coupled to driving circuitry 40 so that signals received from core 50 or from I/O blocks 20 may be selected for driving onto the line segments 13a–13e and 14a–14e through driving circuitry 40. Additional driving circuitry 41 is also coupled to line segments 13a–13e and 14a–14e for driving signals received through selection circuitry from either core 50 or I/O blocks 20 (selection circuitry shown and described in further detail with regard to FIG. 2 and FIG. 3). Driving circuitry 40 and additional driving circuitry 41 are coupled to line segments 13a–13e and 14a–14e to drive signals in a counter clockwise direction as shown.

Driving circuitry that may be used to implement driving circuitry 30, 31, 40, and 41 is well known and a variety of circuits sometimes referred to as "drivers" or "buffers" may be used. As shown in further detail with regard to FIG. 2 and FIG. 3, in the preferred embodiment, driving circuitry 30 and 40 and additional driving circuitry 31 and 41 are tristatable to help ensure that a single line (e.g. line 11a), is only driven by one signal at a particular point in time.

Continuing with the description of FIG. 1, first line segments 11a–11e are staggered relative to second line segments 12a–12e. In other words, breaks between first line segments (i.e. positions at which one line segment ends and another begins) are different relative to corresponding I/O blocks than are breaks between second line segments. For example, first line segment 11a ends and first line segment 11b begins below the I/O block 20 labeled n+24 whereas second line segment 12a ends and second line segment 12b begins below the I/O block labeled n+23. Note that although in the illustrated preferred embodiment, one line segment ends and another starts within the span of a single I/O block, that may not necessarily be the case in alternative embodiments. For example, breaks between line segments might occur between I/O blocks.

In similar fashion, third line segments 13a–13e are staggered relative to fourth line segments 14a–14e as shown.

In the preferred embodiment, the complete I/O bus (of which I/O bus portion 10 is a part) is 48 lines wide. Only four of the 48 lines are shown to avoid overcomplicating the drawing. Of those 48 lines, 24 are driven clockwise and 24 are driven counterclockwise. Note that, as illustrated, the lines are driven by driving circuitry in portions of the lines corresponding to the first three I/O blocks spanned by each line. Also note that, as illustrated, each line spans a total of 24 I/O blocks (not counting the first I/O block corresponding to the line's initial driving point). Thus, given the staggering of lines illustrated in FIG. 1, each I/O block has a total of two clockwise and two counterclockwise I/O bus lines with drivers proximate to the I/O block position. Those skilled in the art will appreciate that in alternative embodiments, different bus widths, staggering patterns, and driving patterns may be chosen depending on the design factors, processes, and implementing environments of particular applications without necessarily departing from the spirit and scope of the present invention. The present embodiment provides just one example of a bus width, a staggering pattern, and a driving pattern in accordance with an aspect of the present invention.

The physical length of the line segments along a top (e.g., lines 11a, 11b, 12a, 12b, 13d, 13e, 14d, and 14e), bottom (not separately shown), left (not separately shown), and right (e.g., lines 11d, 11e, 12d, 12e, 13a, 13b, 14a, and 14b) sides in a preferred embodiment is optimized for long signal routes (for ease of illustration, FIG. 1 only shows lines along a top and right side portion). "Long" signal routes are defined as those routes for which optimum speed and signal strength are achieved by using more than one line. As will be appreciate by those skilled in the art, given the many factors associated with implementing a particular integrated circuit (e.g., the architecture, the silicon process, the loading on the line, the fanout on the line, the width of the metal chosen for layout, the driver size, operating temperature, voltage, etc.), there will typically be a maximum distance that a single line can efficiently carry a given signal. For any signal route longer than such a maximum distance, it is more effective for maintaining signal speed and strength to re-buffer the signal onto another line than to provide a single line of a length equal to or greater than the signal route. That maximum distance, once determined, typically indicates the optimum line length for long signal routes. Determining the optimum line length for long signal routes in a given integrated circuit can be readily done using known techniques and known circuit simulation software as will be appreciated by those skilled in the art. Once the relevant parameters are known for a particular integrated circuit or portion of an integrated circuit, circuit simulators may be used to identify the line length at which signal speed and strength are optimized over long routes. In the illustrated preferred embodiment, the line length is optimized assuming high fanout. As shown and described with regard to FIG. 2 and FIG. 3, two tapping buffers (61 and 62) per I/O block spanned are provided along each line (one to drive into the I/O block and another to drive onto core routing). This frequency of tapping buffers is taken into account when using simulation to determine the optimum line length for long signal routes in the illustrated preferred embodiment.

In the particular embodiment illustrated, the physical length of the segmented I/O bus lines optimized for long routes corresponds to a logical length of 24. The logical length is equal to the number of I/O blocks spanned by the line not counting the I/O block corresponding to the point from which the line is first driven. However, those skilled in the art will appreciate that many variable design parameters will affect the optimal line length for long routes on a particular integrated circuit. Thus, other embodiments may have an optimal logical line length for long signal routes that is greater or less than 24. Moreover, for purposes of embodiments illustrating and claims defining aspects of the present invention, the "optimal" line length for long routes is not a strictly precise quantity. Because a range of deviation from line length determined in simulation to be optimal will not have a significant impact on performance, a line length is considered "optimized" for long signal routes if it is of a length within a reasonable range of what would be considered optimal. For example, because the density of I/O blocks on a side of a chip may be different than the density of I/O blocks on a top or bottom of a chip, lines of a given logical length (e.g. 24) on the top and bottom of the chip may have a somewhat different physical length than lines of the same logical length on the sides of the chip. Although in such an instance none of the lines might be of a length exactly equal to the ideal long route line as determined in simulation, they would still be said to be of a length "optimized" for long-route signals. Moreover, other design considerations might dictate deviations from an ideal length. Such deviations might still permit good performance over long routes (relative to line lengths of much higher deviations from the ideal speed-optimized line length) and thus would still render the lines "optimized" for long signal routes. For example, in the context of deviations from the presently illustrated embodiment, a logical length of 18 might still provide a physical length that would be considered "optimized" for long signal routes, while a logical length of six would likely not be considered to provide a physical length optimized for long signal routes.

FIG. 2 illustrates in further detail connections along line 11b and part of lines 11a and 11c of the embodiment illustrated in FIG. 1. As shown, driving circuitry 30 receives input via multiplexor (mux) 35. Inputs to mux 35 are coupled to receive signals from an I/O block 20 (n+24) and from two different vertical routing lines 81. Vertical routing lines 81 are part of the routing resources of core 50 used for delivering signals to and from core elements including logic array blocks (LABs) 70. Another input to mux 35 is coupled to receive signals from another line segment 11a (only a small portion of line segment 11a is shown). Mux 35 can thus be used to select signals received from an I/O block 20 (n+24), one of two core vertical routing lines 81, or from line segment 11a. The selected signal can be driven onto line 11b by a driver 30 as shown.

Two additional drivers 31 are coupled to drive signals onto line 11b. The illustrated drivers 31 receive signals from respective muxes 36. Inputs to each mux 36 are coupled to receive signals from an I/O block 20 (n+25 and n+26 respectively) and from two vertical core routing lines 81 as shown. Driver 30 and drivers 31 coupled to line 11b are tristatable to help ensure that only one signal is driving line 11b at a particular point in time.

Another driver 30 is shown coupled to drive line 11c. That driver 30 is coupled to receive input from another mux 35 as shown. Inputs to that mux 35 are coupled to receive signals from an I/O block 20 (n+48), two core routing lines 81, and line 11b.

Tapping buffers 61 couple lines 11b and 11c to provide signals to I/O blocks 20 as shown. Tapping buffers 62 couple lines 11b and 11c to provide signals to core vertical routing lines 81 as shown. Each buffer 62 is coupled to provide a signal to two different lines 81. Additional muxing is coupled between the output of tapping buffers 61 and I/O blocks 20 and between the output of tapping buffers 61 and lines 81 (additional muxing not separately shown). The use of tapping buffers to couple line segments 11b and 11c for providing signals to I/O blocks 20 and vertical routing lines 81 allows high fanout of signals on I/O bus lines 11b and 11c without the unduly high parasitic capacitance and other loading that would otherwise occur if those lines were coupled to provide high fanout without the use of buffers.

By providing lines such as line 11b that can both receive signals from and provide signals to core circuitry, an aspect of the illustrated embodiment facilitates use of the peripheral bus for selected core-to-core routing as well as I/O-to core or core-to-I/O routing. Those skilled in the art will appreciate that known techniques can be used to determine a route of optimum efficiency from among a plurality of routes between two points in a device core. In an aspect of the illustrated embodiment, access is provided from and to the core along the same peripheral bus line segment. This facilitates selecting a route of optimum efficiency between two core points from a selection of possible routes that includes not just routes over core circuitry, but also routes over the peripheral bus.

FIG. 3 illustrates in further detail connections along line 13b and part of lines 13a and 13c of the embodiment illustrated in FIG. 1. As shown, driving circuitry 40 receives input via multiplexor (mux) 45. Inputs to mux 45 are coupled to receive signals from an I/O block 20 (n+73) and from a horizontal routing lines 91. Horizontal routing lines 91 are part of the routing resources of core 50 used for delivering signals to and from core elements including logic array blocks (LABs) 70. Another input to mux 45 is coupled to receive signals from another line segment 13a. Mux 45 can thus be used to select signals received from an I/O block 20 (n+73), a core horizontal routing line 91, or from line segment 13a. The selected signal can be driven onto line 13b by a driver 40 as shown.

Two additional drivers 41 are coupled to drive signals onto line 13b. The illustrated drivers 41 receive signals from respective muxes 46. Inputs to each mux 46 are coupled to receive signals from an I/O block 20 (n+72 and n+71 respectively) and from a horizontal routing line 91 as shown. Driver 40 and drivers 41 coupled to line 13b are tristatable to help ensure that only one signal is driving line 13b at a particular point in time.

Another driver 40 is shown coupled to drive line 13c. That driver 40 is coupled to receive input from another mux 45 as shown. Inputs to that mux 45 are coupled to receive signals from an I/O block 20 (n+49), a core routing line 91, and line 13b.

Tapping buffers 61 couple lines 13a and 13b to provide signals to I/O blocks 20 as shown. Tapping buffers 62 couple lines 13a and 13b to provide signals to core horizontal routing lines 91 as shown. Additional muxing is coupled between the output of tapping buffers 61 and I/O blocks 20 and between the output of tapping buffers 61 and lines 91 (additional muxing not separately shown).

Note that the number of vertical routing lines 81 fed by each tapping buffer 62 on lines such as line 11b along the top of the I/O bus 10 (see FIG. 2 and accompanying text) is greater than the number of horizontal routing lines 91 fed by each tapping buffer 62 on lines such as line 13b along a side of the I/O bus 10. This discrepancy is simply due to the particular layout and shape of LABs and I/O blocks on the PLD 100 of the illustrated embodiment. Those skilled in the art will appreciate that alternative architectures may provide for different numbers of couplings to core routing resources than those illustrated without necessarily departing from the spirit and scope of the present invention.

Figure 4:
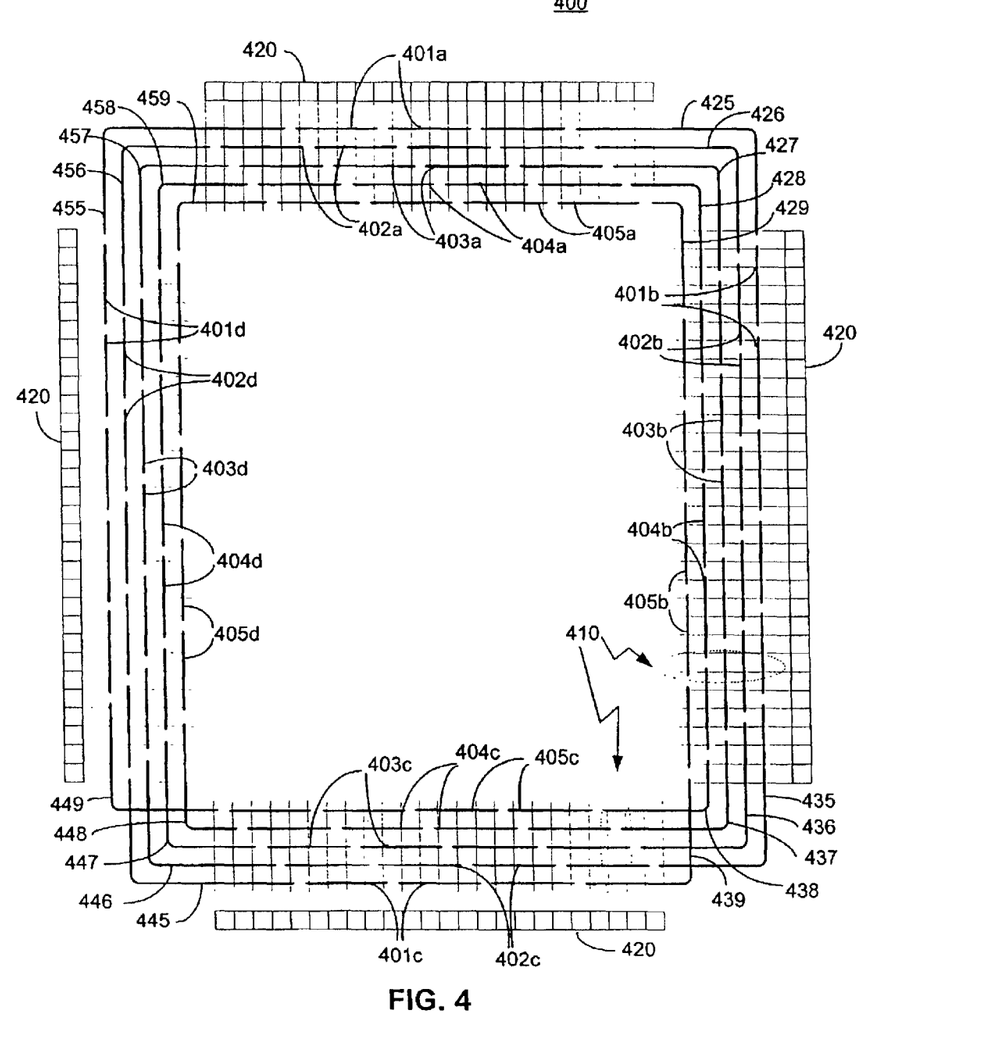
FIG. 4 illustrates a layout facilitating implementation of a bus in accordance with an aspect of the present invention, the bus having lines of consistent logical length whether or not the number of I/O blocks is an integral multiple of the logical length of each individual line.

FIG. 4 illustrates an integrated circuit portion 400 including I/O bus 410 and I/O blocks 420. I/O bus 410 includes a series of staggered line segments arranged around the periphery of integrated circuit portion 400. On the top, left, right, and bottom sides of the periphery, the staggered lines segments of I/O bus 410 are arranged in five tracks of lines as follows: On the top side portion of I/O bus 410, line segments 401a (three line segments), 402a (four line segments), 403a (four line segments), 404a (four line segments), and 405a (four line segments) are arranged in, respectively, a first track, a second track, a third track, a fourth track, and a fifth track. On the right side portion of I/O bus 410, line segments 401b (five line segments), 402b (five line segments), 403b (five line segments), 404b (five line segments), and 405b (five line segments) are arranged in, respectively, a first track, a second track, a third track, a fourth track, and a fifth track. On the bottom side portion of I/O bus 410, line segments 401c (three line segments), 402c (four line segments), 403c (four line segments), 404c (four line segments), and 405c (four line segments) are arranged in, respectively, a first track, a second track, a third track, a fourth track, and a fifth track. On the left side portion of I/O bus 410, line segments 401d (five line segments), 402d (five line segments), 403d (five line segments), 404d (five line segments), and 405d (five line segments) are arranged in, respectively, a first track, a second track, a third track, a fourth track, and a fifth track.

As illustrated, each of line segments 401a–d, 402a–d, 403a–d, 404a–d, and 405a–d is a logical length of five where the logical length is measured by the number of I/O blocks 420 spanned by the line, not counting the I/O block from which the line is first driven (driving circuitry for the lines is not separately shown). However, the line segments are shown to be of length five only in order to avoid overcomplicating the drawing. In a preferred embodiment, a physical length of the staggered line segments would be optimized for long signal routes, and such an optimized length may correspond to a greater logical line length than that of the lines illustrated. Moreover, I/O bus 410 is shown to have a "width" of only five lines at any given point for purposes of not overcomplicating the drawing. However, in an actual implementation, an I/O bus may have a different number of lines and may be much "wider" in terms of number of lines than the bus 410 shown in the drawing.

Corner lines 425–429, 435–439, 445–449, and 455–459 provide signal paths between staggered line segments on adjacent portions of the periphery (circuitry completing the coupling between lines not separately chosen). Between line segments on the top portion of bus 410 and the right hand portion of bus 410, corner lines provide signal paths as follows: corner line 425 provides a signal path from a line 401a to a line 401b; corner line 426 provides a signal path from a line 402a to a line 402b; corner line 427 provides a signal path from a line 403a and a line 403b; corner line 428 provides a signal path from a line 404a to a line 404b; and corner line 429 provides a signal path from a line 405a to a line 405b.

Between line segments on the right hand portion of bus 410 and line segments on the bottom portion of bus 410, corner lines provide a signal path from line segments in one track to line segments in another track: Corner line 435 provides a signal path from a line segment 401b (in a first track) and line segment 402c (in a second track); corner line 436 provides a signal path from a line segment 402b (in a second track) to a line segment 403c (in a third track); corner line 437 provides a signal path from a line segment 403b (in a third track) to a line segment 404c (in a fourth track); corner line 438 provides a signal path from a line segment 404b (in a fourth track) to a line segment 405c (in a fifth track); corner line 439 provides a signal path from a line segment 405b (in a fifth track) to a line segment 401c (in a first track).

Similarly, between line segments on the bottom portion of bus 410 and line segments on the left hand portion of bus 410, corner lines provide a signal path from line segments in one track to line segments in another track: Corner line 445 provides a signal path from a line segment 401c (in a first track) and line segment 402d (in a second track); corner line 446 provides a signal path from a line segment 402c (in a second track) to a line segment 403d (in a third track); corner line 447 provides a signal path from a line segment 403c (in a third track) to a line segment 404d (in a fourth track); corner line 448 provides a signal path from a line segment 404c (in a fourth track) to a line segment 405d (in a fifth track); corner line 449 provides a signal path from a line segment 405c (in a fifth track) to a line segment 401d (in a first track).

Finally, between line segments on the left hand portion of bus 410 and the top portion of bus 410, corner lines provide signal paths as follows: corner line 455 provides a signal path from a line 401d to a line 401a; corner line 456 provides a signal path from a line 402d to a line 402a; corner line 457 provides a signal path from a line 403d and a line 403a; corner line 458 provides a signal path from a line 404d to a line 404a; and corner line 459 provides a signal path from a line 405d to a line 405a. Note that, consistent with the embodiment of FIGS. 1–3 and consistent with the broad definition of coupled discussed above (see paragraph [0019]), corner lines in an embodiment such as the embodiment of FIG. 4 may be said to "provide a signal path" between two line segments even if that path is mediated by field programmable circuitry that is not currently configured to transmit signals between the two line segments by way of the corner line.

Corner lines 425–429, 435439, 445–449, and 455–459 all have a logical length of five. As will be appreciated by those skilled in the art, corner lines arranged on an integrated circuit will not necessarily be implemented by a single conductive wire. For example, in one implementation, a first corner line portion is provided on a vertical track that exists on one metal layer and a second portion of the same corner line is provided on a horizontal track that exists on another metal layer, the two portions of the corner line being coupled by, for example, a via between the two metal layers. Such a via may or may not be field programmable without necessarily departing from the spirit and scope of the present invention. As one other example, a commercial routing product might be used to provide signal paths between line segments on adjacent sides (e.g. a top portion and a night hand portion) of an I/O bus, thereby effectively presenting corner lines of a desired logical length. As will be further appreciated by one skilled in the art, in particular one of such various implementations, line segments that are not corner lines (e.g., peripheral bus lines on a top, bottom, left, or right side portion) may have a physical length optimized for long signal routes while the associated corner lines are not necessarily of an optimized physical length even if they effectively present a matching logical length.

It may be desirable to implement a bus such as bus 410 with lines that are of a uniform logical length. For example, such uniformity may facilitate the design of routing algorithms utilizing the I/O bus. However, this may be difficult to accomplish if a bus around the entire periphery is desired and if the total number of I/O blocks is not an integral multiple of the desired logical length (e.g., a logical length corresponding to a physical length optimized for long routes). For example, integrated circuit portion 400 has 108 I/O blocks. The logical line length of illustrated lines is five. If one attempted to couple lines together along the same track around the periphery of integrated circuit 400, the logical length of all lines could not be equal to five. For example, if five tracks were connected in five separate "loops," for each track loop, 21 lines of logical length five could be used, but a 22nd line would have to be of length three to have the single track loop span all 108 I/O blocks. However, a spiral pattern such as that illustrated in FIG. 4 allows a continuous bus to be implemented using multiple tracks by coupling some lines together that exist in different tracks on adjacent portions of the bus. In this manner, all lines are of uniform logical length even though the total number of circuit portions (in this case, I/O blocks) used for measuring logic length (108) is not an integral multiple of the uniform line length chosen (five).

An exemplary method for designing an arrangement of staggered line segments of uniform logical length to provide signal paths around a periphery of an electronic device when the total number of I/O blocks is not equal an integral multiple of the desired uniform logical length may be summarized as follows:

Provide staggered line segments on the top, bottom, left and right portions of the periphery such that the staggered, line segments provided each have the desired logical length and are arranged in a desired number of tracks; and provide corner lines, each corner line providing a signal path from a staggered line on one side of the periphery to another staggered line on an adjacent side of the periphery such that the corner lines present a line of logical length equal to the desired logical length of the staggered line segments on the top, bottom, left, and right side portions of the periphery.

As can be seen from the exemplary arrangement of FIG. 4, the lines other than the corner lines are arranged such that only lines that can be placed along the sides (top, bottom, left, right) without extending beyond the last I/O block of that side are used. The corner lines are used to span any remaining I/O blocks on each adjacent side to create a corner line of the selected logical length.

In the illustrated present embodiment, lines in the same track on a top, bottom, left, or right side of the bus 410 are coupled together (coupling circuitry not separately shown) to form signal paths. For example, lines 401a are coupled together, lines 402a are coupled together, lines 404c are coupled together, etc. However, in an alternative embodiment, signal paths may jump from track to track between lines (e.g., in the context of the illustration of FIG. 4, in such an alternative, a line such as a line 401a might be coupled to a line 402a) without necessarily departing from the spirit and scope of aspects of the invention. In another alternative embodiment, line segments may not all be coupled together to form a continuous loop around a periphery without necessarily departing from the spirit and scope of aspects of the invention.

Although particular embodiments have been described in detail, various modifications to the embodiments described herein may be made without departing from the spirit and scope of the present invention, thus, the invention is limited only by the appended claims.

What is claimed is:

1. A peripheral bus comprising:
    pluralities of line segments on a periphery of an electronic device, wherein:
    line segments of the pluralities of line segments are staggered such that positions of start and end points of line segments of one plurality of line segments correspond to different portions of I/O circuitry of the electronic device than do positions of start and end points of line segments of another plurality of line segments;

at least some line segments of the pluralities of line segments are coupled to receive signals from the I/O circuitry of the electronic device, from a core of the electronic device, and from at least one other line segment of the pluralities of line segments;

at least some line segments of the pluralities of line segments are coupled to provide a signal to the I/O circuitry of the electronic device, to the core of the electronic device, and to at least one other line segment of the pluralities of line segments.

2. The peripheral bus of claim 1 wherein:

driving and selection circuitry couples the line segments of the pluralities of line segments that are coupled to receive signals from the I/O circuitry of the electronic device, from the core of the electronic device, and from the least one other line segments to drive selected ones of the received signals in a first direction.

3. The peripheral bus of claim 2 wherein:

additional driving and selection circuitry couples the line segments of the pluralities of line segments that are coupled to receive signals from the I/O circuitry of the electronic device and from the core of the electronic device to drive selected ones of the received signals in the first direction.

4. The peripheral bus of claim 2 further comprising:

additional pluralities of line segments;

wherein:

line segments of the additional pluralities of line segments are staggered such that positions of start and end points of line segments of one plurality of the additional pluralities of line segments correspond to different portions of I/O circuitry of the electronic device than do positions of start and end points of line segments of another plurality of the additional pluralities of line segments; and driving and selection circuitry couples at least some line segments of the additional pluralities of line segments to receive signals from the I/O circuitry of the electronic device, from the core of the electronic device, and from other line segments of the additional pluralities of line segments and drives selected ones of the received signals in a second direction different from the first direction.

5. The peripheral bus of claim 1 wherein:

the I/O circuitry includes I/O blocks; and each line segment of the pluralities of line segments has a logical length of N where N is the number of I/O blocks spanned by the line.

6. The peripheral bus of claim 5 wherein N is chosen to optimize for signal speed at routes of length greater than N.

7. The peripheral bus of claim 1 wherein the line segments are coupled to provide signals to the I/O circuitry of the electronic device and to the core of the electronic device through buffers.

8. The peripheral bus of claim 1 wherein:

the I/O circuitry includes I/O blocks; and the line segments are coupled to provide signals to the I/O circuitry and to the core of the electronic device through buffers at least once per I/O block of the electronic device.

9. A peripheral bus comprising:

pluralities of staggered line segments arranged to form a plurality of tracks on sides of an integrated circuit; and pluralities of corner lines arranged at four corners of the peripheral bus;

wherein the staggered line segments and corner lines are arranged such that the corner lines and the staggered line segments have a logical length of N whether or not the number of I/O blocks spanned by the peripheral bus is an integral multiple of N.

10. The peripheral bus of claim 9 wherein some corner lines are coupled to different tracks on adjacent sides of the integrated circuit.

11. The peripheral bus of claim 10 wherein some corner lines are coupled to the same tracks on adjacent sides of the integrated circuit.

12. A programmable logic device comprising the peripheral bus of claim 1.

13. A programmable logic device comprising the peripheral bus of claim 2.

14. A programmable logic device comprising the peripheral bus of claim 3.

15. A programmable logic device comprising the peripheral bus of claim 4.

16. A programmable logic device comprising the peripheral bus of claim 5.

17. A programmable logic device comprising the peripheral bus of claim 6.

18. A programmable logic device comprising the peripheral bus of claim 7.

19. A programmable logic device comprising the peripheral bus of claim 8.

20. A programmable logic device comprising the peripheral bus of claim 9.

21. A programmable logic device comprising the peripheral bus of claim 10.

22. A programmable logic device comprising the peripheral bus of claim 11.

23. A peripheral bus comprising:

pluralities of staggered, segmented means for routing signals arranged on a periphery of an electronic device;

means for coupling the pluralities of staggered, segmented means to provide signals to a core of the electronic device;

means for coupling the pluralities of staggered, segmented means to provide signals to I/O circuitry of the electronic device; and means for coupling at least some staggered, segments means of the pluralities of staggered, segmented means to receive signals from the I/O circuitry, the core, and other of the staggered, segmented means.

24. The peripheral bus of claim 23 wherein:

some of the staggered, segmented means of the pluralities of staggered, segmented means are coupled together for driving signals in a first direction; and some of the staggered, segmented means of the pluralities of staggered, segmented means are coupled together for driving signals in a second direction different from the first direction.

25. In an integrated circuit having a peripheral bus wherein a logical length of peripheral bus lines is measured relative to a given unit of circuit components, a method of arranging segmented peripheral bus lines comprising:

providing line segments on sides of the integrated circuit arranged in a plurality of tracks and arranged in a staggered manner, each of the line segments having a same selected logical length; and providing corner lines, each corner line arranged to provide a signal path between a respective two of the line segments on adjacent sides of the integrated circuit, the respective two line segments being chosen and the each corner line being arranged such that a logical length of each corner line is equal to the selected logical length.

26. The method of claim 25 wherein at least some of the respective two line segments are in different tracks.

27. The method of claim 26 wherein at least some of the respective two line segments are in the same track.

* * * * *